United States Patent [19]

Onodera et al.

[11] Patent Number: 5,570,993

[45] Date of Patent: Nov. 5, 1996

[54] METHOD FOR MOUNTING COMPONENTS AND APPARATUS THEREFOR

[75] Inventors: Hitoshi Onodera; Hiroshi Sakurai, both of Iwata, Japan

[73] Assignee: Yamaha Hatsudoki Kabushiki Kaisha, Iwata, Japan

[21] Appl. No.: 103,353

[22] Filed: Aug. 9, 1993

Related U.S. Application Data

[63] Continuation-in-part of Ser. No. 103,358, Aug. 9, 1993.

[30] Foreign Application Priority Data

Aug. 7, 1992 [JP] Japan ................................. 4-211839
May 13, 1993 [JP] Japan ................................. 5-111270

[51] Int. Cl.$^6$ ......................................................... H05K 13/04
[52] U.S. Cl. .............................. 414/783; 29/740; 29/743; 356/375; 356/400
[58] Field of Search .................................... 414/783, 787, 414/901, 29; 901/17, 35, 40, 41, 47; 29/740, 743, 757; 294/907; 356/375

[56] References Cited

U.S. PATENT DOCUMENTS

| 4,706,372 | 11/1987 | Ferrero et al. | 901/41 |
|---|---|---|---|
| 4,832,543 | 5/1989 | Negri et al. | 901/35 |
| 4,964,208 | 10/1990 | Fujioka | 29/740 |
| 4,973,216 | 11/1990 | Domm | 901/47 |
| 5,005,978 | 4/1991 | Skunes et al. | 356/372 |
| 5,017,082 | 5/1991 | Kobayashi | 901/35 |
| 5,105,528 | 4/1992 | Soth et al. | 29/740 |
| 5,176,492 | 1/1993 | Nakamura | 901/35 |
| 5,253,414 | 10/1993 | Gaudette et al. | 29/743 |
| 5,278,634 | 1/1994 | Skunes et al. | 356/400 |

FOREIGN PATENT DOCUMENTS 0293175  5/1988  European Pat. Off. .

OTHER PUBLICATIONS

Patent Abstract of Japan vol. 013, No. 173 (E-748) 24 Apr. 1989 JP-A-64 002 400 (Tamura Seisakushi Co Ltd) * Abstract *.

*Primary Examiner*—Karen Merritt
*Assistant Examiner*—Gregory A. Morse
*Attorney, Agent, or Firm*—Knobbe, Martens, Olson & Bear

[57] ABSTRACT

A component mounting device adapted to mount components such IC or the like on a printed circuit board that includes replaceable pick up nozzles to accommodate different types of components to be picked up. A sensing station is provided that permits the pick up nozzle to be verified as the correct one and also to determine, if desired, its orientation and misalignments in its axis of rotation so as to permit adjustment in the mounted to accommodate for errors. In addition, a reference height position may be set so that the same sensing station can be employed to sense both the orientation of a component that is picked up and also whether the component is correctly oriented for deposit. This is done by measuring projected lengths in a plane with a photo sensitive device and by making calculations in accordance with trigonometric relationships.

46 Claims, 16 Drawing Sheets

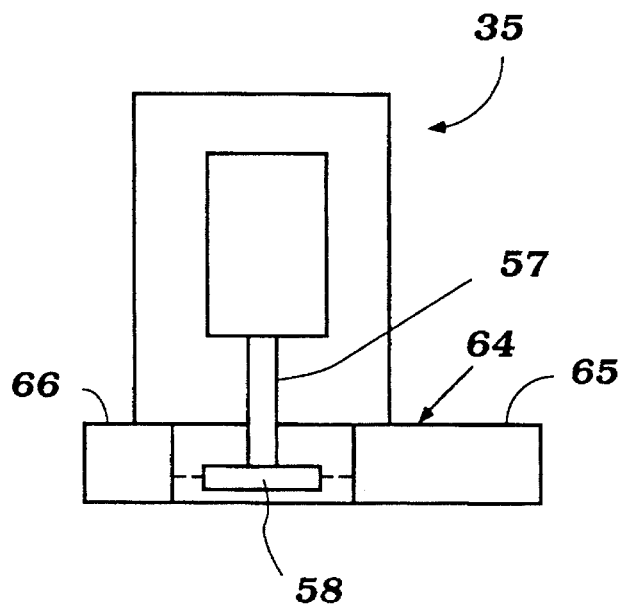
Figure 10
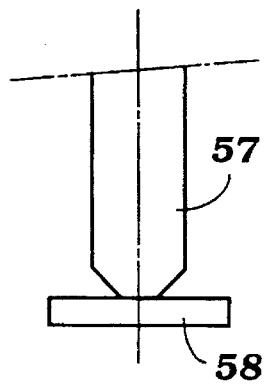 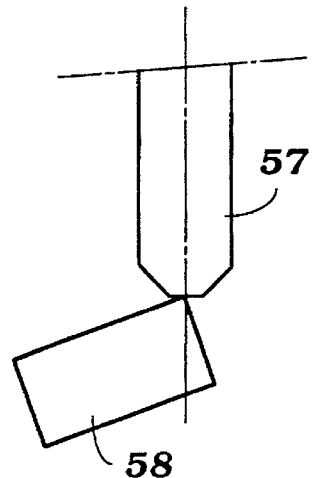 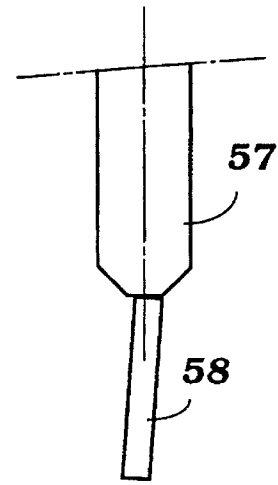
Figure 11　　Figure 12　　Figure 13

METHOD FOR MOUNTING COMPONENTS AND APPARATUS THEREFOR

CROSS REFERENCE TO RELATED APPLICATION

This is a Continuation-in-Part of the application of the same title, Ser. No. 08/103,358 Filed Aug. 09, 1993 in the name of Hiroshi Onodera (Attorney Docket #2503-02328) assigned to the assignee hereof.

BACKGROUND OF THE INVENTION

This invention related to a method for mounting components and an apparatus therefor and more particularly to an improved arrangement that permits the accurate picking up and mounting of components and a method for performing such operations.

There are a wide variety of applications wherein components are picked up from a feed section where they are delivered and moved to and placed at an accurate location. A wide variety of devices are employed for actually picking up the components. Frequently such pick up devices employ vacuum nozzles for picking up the components.

A specific application for this type of apparatus and method is in the making of printed circuit boards. With such printed circuit boards, it is common to employ a device called a "chip mounter" that picks up small components such as integrated circuits, resistors or capacitors at a feed section and places them on a printed circuit board. Vacuum nozzles are frequently employed as the pick up devices.

In order to render such devices more versatile, it has been proposed to provide an arrangement wherein the form and type of pick up nozzle employed may be readily changed so as to suit particular components. This nozzle changing may be done either manually or automatically.

The criticality for accurately mounting such components is readily apparent. However, in the process of mounting the nozzle, mistakes may be made even if the apparatus functions automatically and these mistakes can result in inaccurate mounting of the components and other problems. For example the interchangeable pick up devices may by their very nature have different lengths or different configurations from each other. Frequently, however, it is necessary or desirable to perform a further operation on the component once it has been picked up and this operation should be performed at an accurate location. For example, it is a practice to employ an optical sensor for sensing certain characteristics of the component being picked up. However, if the pick up device has different configuration, the picked up component may not be positioned in the proper location for the sensing operation.

It is, therefor, an object of this invention to provide an improved method and apparatus embodying pick up devices wherein the pick up device is sensed so as to provide a reference location where components will be positioned by the pick up device for performing a further operation on the component.

One of the operations that may be performed on the component once it is picked up by the pick up device is a sensing operation that will sense the orientation of the component relative to the pick up device so as to make a corresponding correction in the movement of the component to the mounting position so that it will correctly mounted. One type of device for such sensing involves rotation of the component in front of an optical sensor. However, if the pick up device is mounted in such a way that its axis is displaced from the fixed rotational axis of the apparatus, then the sensing and subsequent calculation of a correction factor may be incorrect.

It is, therefor, a still further object of this invention to provide an improved method and apparatus for determining the rotational axis of a replaceable pick up device once the pick up device has been installed in the apparatus.

SUMMARY OF THE INVENTION

A first feature of the invention is adapted to be embodied in a component handling device that is adapted to pick up and position components which comprises a pick up portion. A sensing station is provided that is adapted to sense a condition of an article. Means are provided for positioning the pick up portion in the sensing station for sensing the orientation of the pick up portion.

In accordance with one feature of the invention, a reference position for the location of the pick up portion is determined from its orientation.

In accordance with another feature of the invention, the rotational axis of the installed pick up portion is determined.

A further feature of the invention is adapted to be embodied in a method of picking up and positioning components with a pick up portion. In accordance with this method, the pick up portion is scanned to determine its orientation.

In accordance with one facet of this method, a reference position of the pick up portion is determined.

In accordance with another facet of this method, the rotational axis of the pick up portion is determined to provide a correction factor, if required.

BRIEF DESCRIPTION OF THE DRAWINGS

FIG. 10 is a front elevational view, in part similar to FIG. 7 and shows the component being sensed.

FIGS. 11, 12 and 13 show how a component may be picked up normally in FIG. 11 and two abnormal conditions in FIGS. 12 and 13.

FIG. 23 is an enlarged front elevational view showing the rotation of the pick up nozzle.

FIG. 24 is a top plan view showing how the offset axis moves during this method and FIG. 25 is a graphical view showing the offset of the rotational axis as it is rotated.

DETAILED DESCRIPTION OF THE PREFERRED EMBODIMENTS OF THE INVENTION

Figure 1:
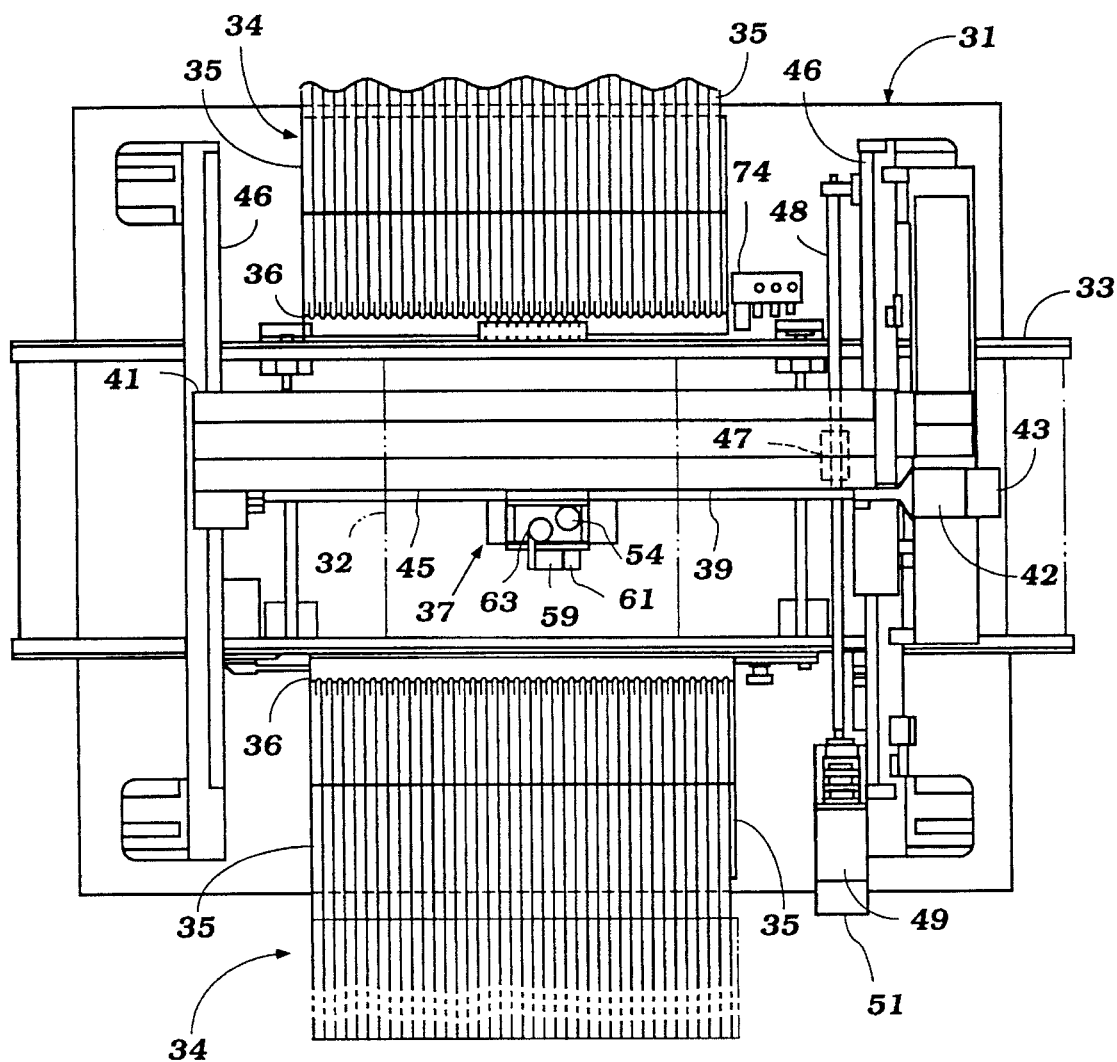
FIG. 1 is a top plan view of a mounting apparatus constructed in accordance with an embodiment of the invention and adapted to perform methods corresponding to the invention.
Figure 2:
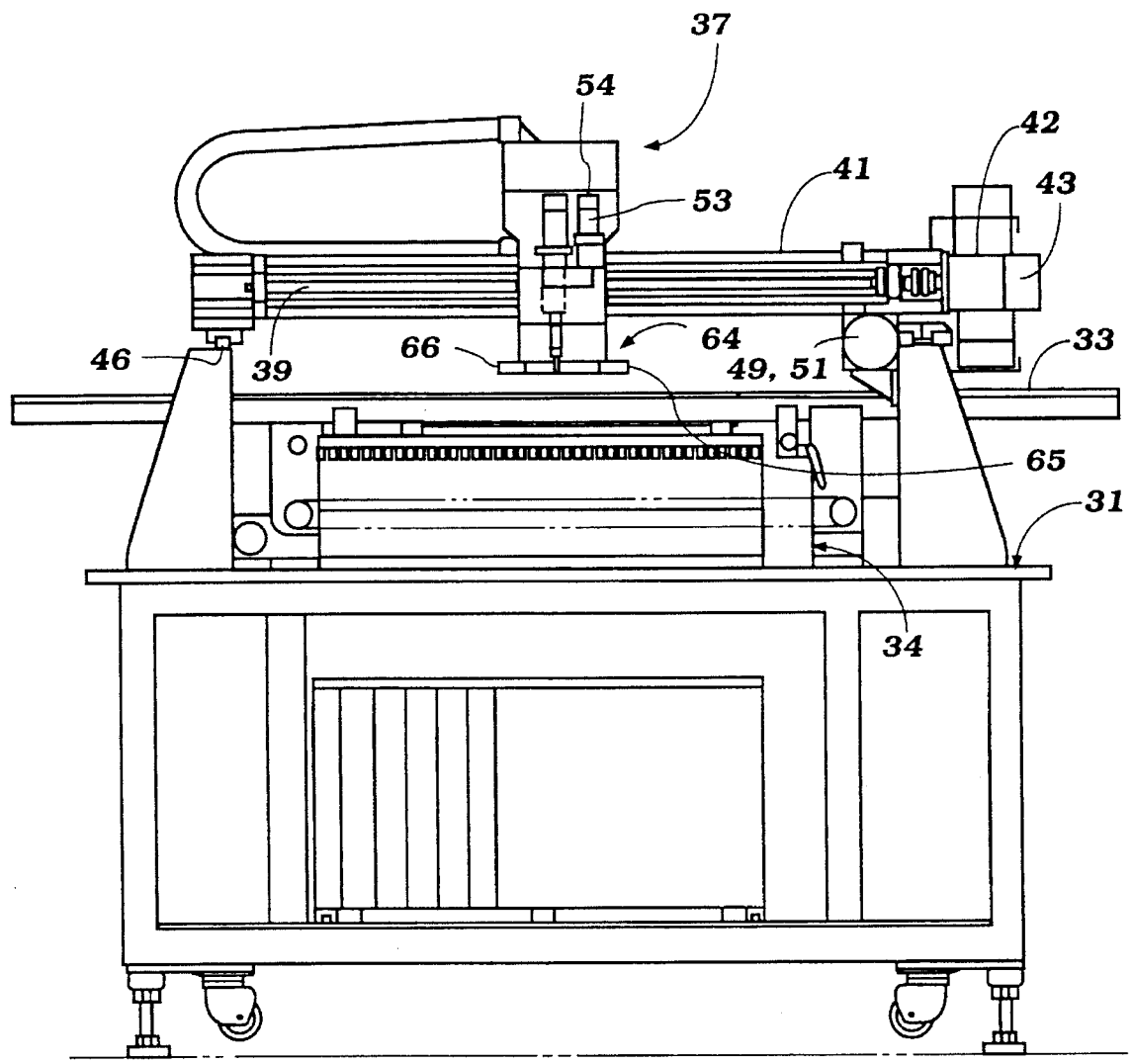
FIG. 2 is front elevational view of the apparatus.

Referring now in detail to the drawings and initially to FIGS. 1 and 2, a chip mounting apparatus constructed in accordance with an embodiment of the invention is identified generally by the reference numeral 31. The chip mounting apparatus 31 is adapted to mount small components such as IC's resistors or capacitors on printed circuit boards 32 that are presented to a mounting station by a conveyor 33 which conveyor extends transversely across the apparatus.

These individual components are presented at delivery stations 34 that are positioned at opposite sides of the conveyor 33 and which are comprised of a plurality of individual rachet operated tape feeders 35. These types of devices are well known and are comprised of carrying tape having individual pockets in which the individual components are positioned. The actual pick up stations are indicated at 36 and are positioned closely adjacent opposite sides of the conveyor 33.

A pick up head assembly, indicated generally by the reference numeral 37 and having a construction that will be described is mounted for movement between the pick up stations 36 and the circuit board 32 for picking up the components and depositing them. In addition, certain other operations will be described later.

The head assembly 37 has a ball nut 38 (FIG. 3) that is drivingly engaged with a feed screw 39 which is, in turn, rotatably carried on a carriage 41. Rotation of the feed screw 39 moves the head assembly 37 in the X—X direction and a driving motor 42 is provided at one end of the carriage 41 for driving the feed screw 39. An encoder 43 is driven by the motor 42 and provides a signal to a control unit, indicated generally by the reference numeral 44 and as shown in the schematic view of FIG. 5, which shows the interrelationship of various components. Guide rails 45 are also provided on the carriage 41 for guiding the movement of the head assembly 37 in the X—X direction.

The carriage 41 is itself moveable along the Y—Y axis being mounted for this movement on a pair of parallel guide rails 46 that extend on opposite sides of the feeder station 34. The carriage 41 has a ball nut 47 that is engaged with a Y—Y axis drive screw 48 which is journalled appropriately on the mechanism 31 and which is driven by an electric drive motor 49. An encoder 51 is coupled for rotation with the drive motor 49 so as to provide a signal indicative of the position of the pick up head assembly 37 in the Y—Y axis.

Figure 3:
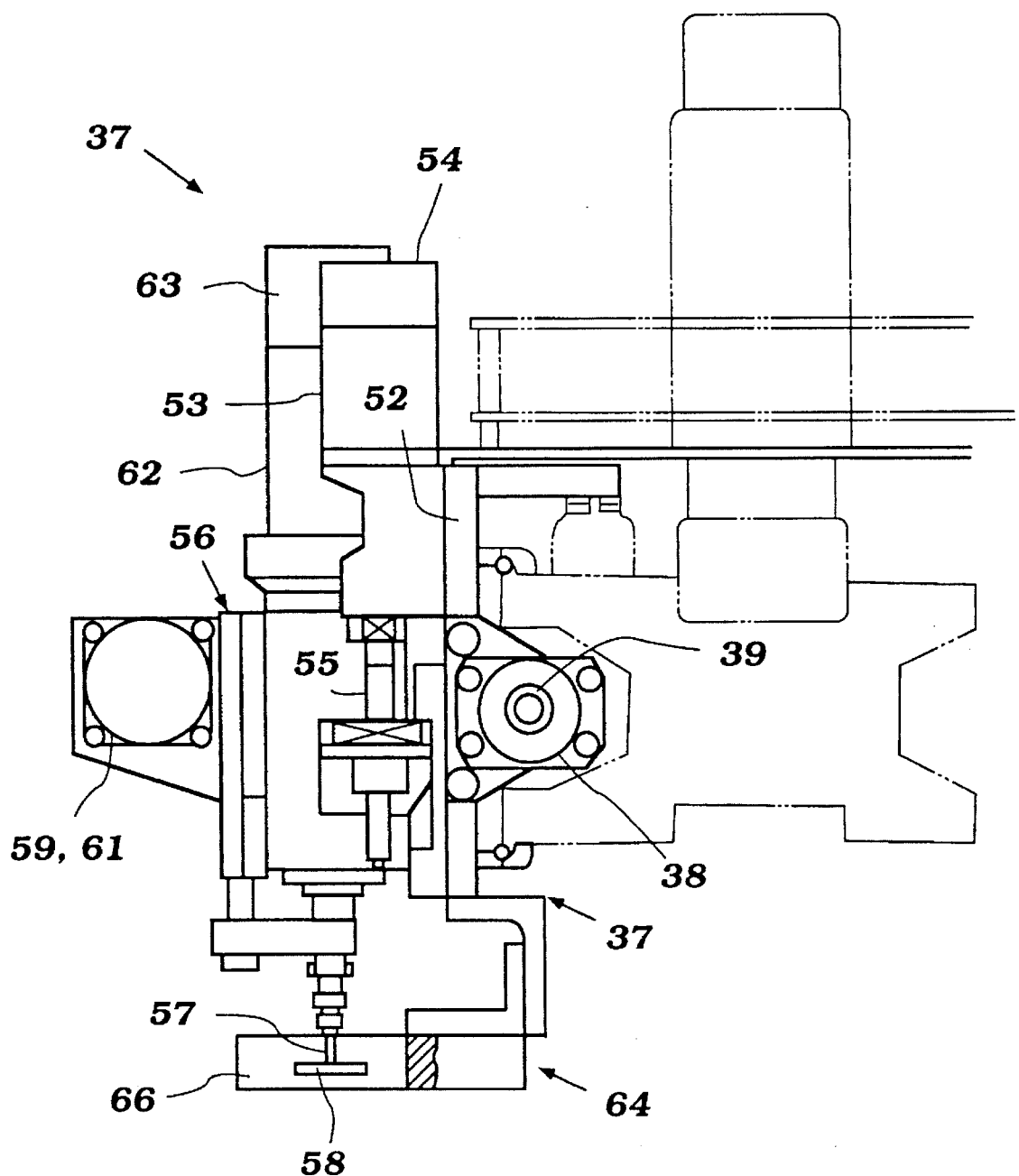
FIG. 3 is an enlarged side elevational view, with a portion shown in section, showing the pick up nozzle and its supporting mechanism.

The head assembly 37 will now be described in detail by primary reference to FIG. 3 although certain of the components are also shown in FIGS. 1 and 2 and the interrelationship of the components is shown schematically in FIG. 5. The head assembly 37 includes a support plate 52 that is mounted for movement along the guide rails 45 and which support a Z axis drive motor 53 having an encoder 54 that provides an output signal indicative of the position of the head assembly 37 along the Z axis. The Z axis drive motor 53 drives a feed screw 55 that has a connection to a ball nut of a pick up head, indicated generally by the reference numeral 56. The pick up 56 is adapted to receive a pick up nozzle 57 of the vacuum operated type. As will be described later, the pick up nozzles 57 are detachably connected to the pick up head 56 so as to provide replacement to accommodate various types of components, indicated generally by the reference numeral 58 that may be picked up by the pick up head 37. The pick up nozzle 57 is mounted also for movement in the Z—Z axis relative to the support plate 52 and is so driven by a servo motor 59 which also has an encoder 61 coupled to it so as to provide an indication of the position of the pick up nozzle 57 relative to the support plate 52. Thus, by determining the positions from the encoders 61 and 54 the location of the pick up nozzle 57 on the Z—Z axis may be readily determined.

The pick up nozzle 57 is also rotatably about a rotational axis R and is driven for this rotation by a rotational axis servo motor 62. The rotational axis servo motor 62 also drives an encoder 63 so as to provide an output signal indicative of the rotational position of the pick up nozzle 57, for a reason which will be described.

Figure 7:
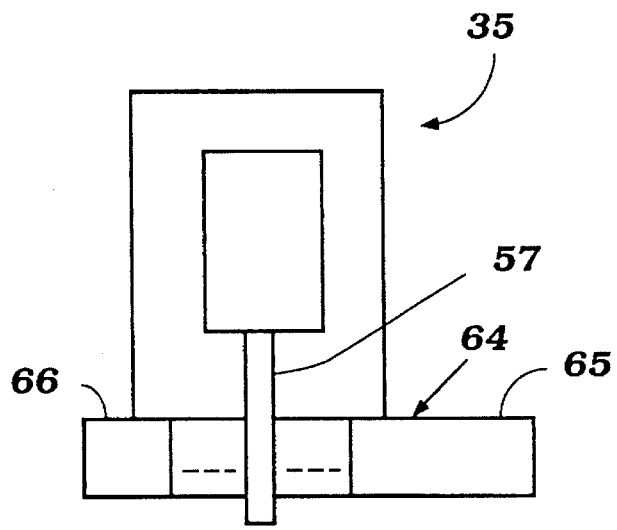
FIG. 7 is an enlarged front elevational view showing the sensing apparatus for the pick up nozzle.
Figure 8:
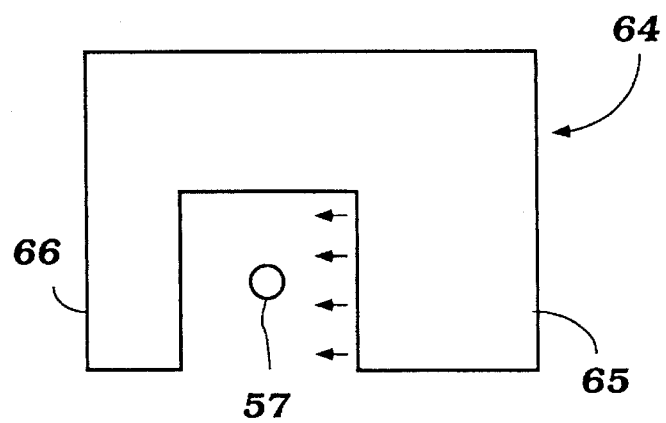
FIG. 8 is a top plan view of the portion of the construction shown in FIG. 7.

Also mounted on the head assembly 37 and specifically the support plate 52 is a sensor device, indicated generally by the reference numeral 64 which, in the illustrated embodiment, is an optical sensor that is comprised of a laser sight source 65 that emits a plurality of parallel light rays as shown FIG. 7 and 8 to a detector unit in the form of a CCD 66. The detector unit 64 functions, as will become apparent, so as to sense objects which obscure the light rays as determined by the output of the detector 66. The output of the sensor 64 being coupled to a processor unit 67 (FIG. 5) also carried by the assembly unit 37 and specifically the supporting plate 52.

Figure 5:
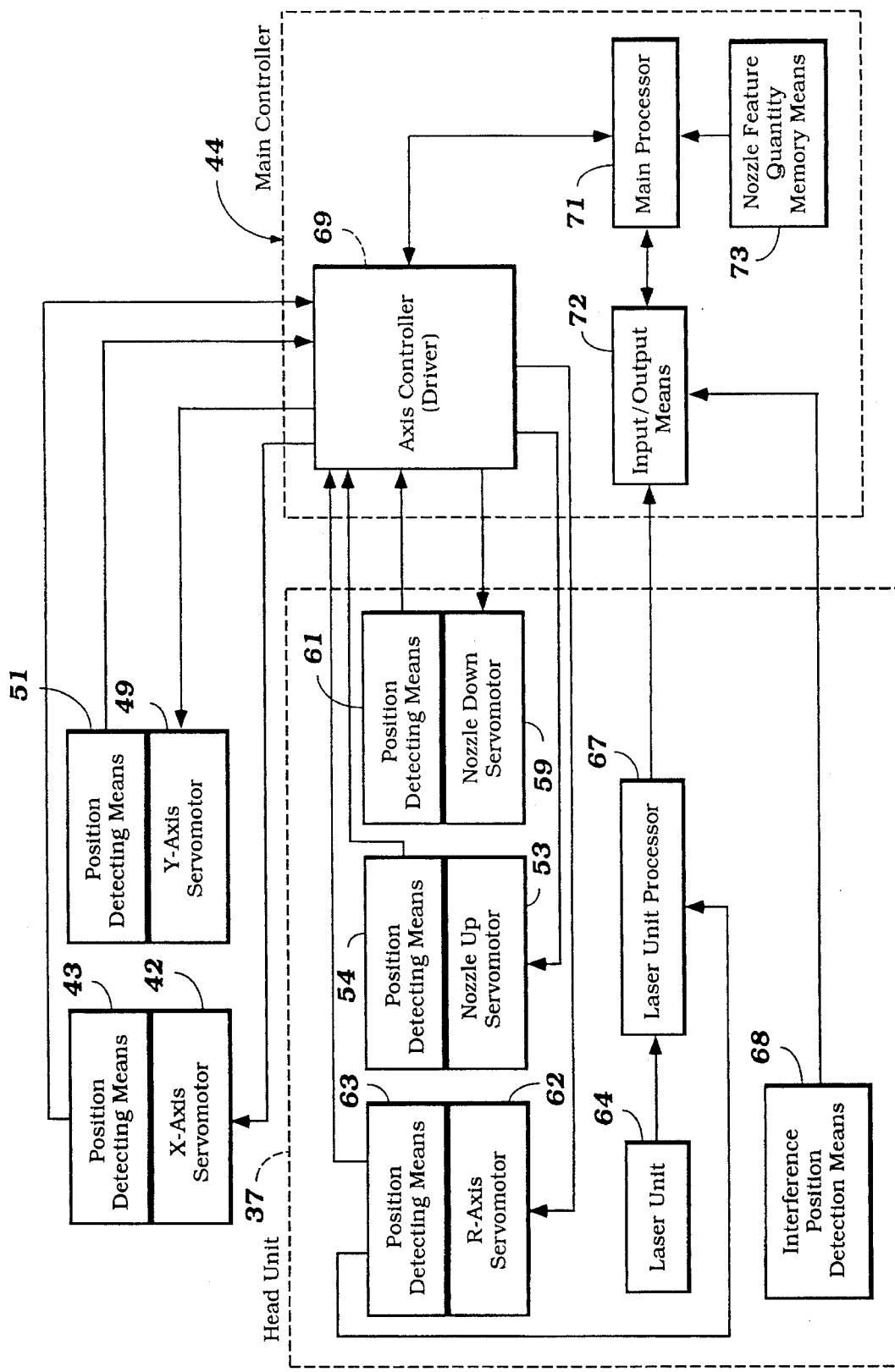
FIG. 5 is a partially schematic view showing the arrangement of the components of the apparatus and their interrelationship.

The head assembly 37 also includes an interference position detecting means which appears only schematically in FIG. 5 and which is identified generally by the reference numeral 68. This interference position detecting means 68 outputs a signal which indicates when the pick up nozzle 57 and a component 58 carried thereby has been elevated sufficiently in the direction of the Z—Z axis so as to clear the pick up stations 36 and permit movement of the mounting head 37 in the X—X and Y—Y directions to begin. By beginning movement immediately after the pick up area 36 has been cleared, the speed of operation of the mechanism can be greatly improved.

The remaining components of the control system will now be described by reference to FIG. 5. The outputs form the various position detectors 43, 51, 61, 64 and 69 are all transmitted to an axis controller or driver 69 which also outputs control signals to the various servo motors 42, 49, 53, 59 and 62 for their operation. The axis controller 69 is controlled by a main processor unit 71 of the controller 44 which also receives signals from the laser processor unit 67 and the interference position detecting means 68 through an input output circuit 72. The device further includes a memory 73 that is pre-programmed with certain information indicative of the profile of the pick up nozzles 57 which, as has been aforenoted, are replaceable.

Figure 4:
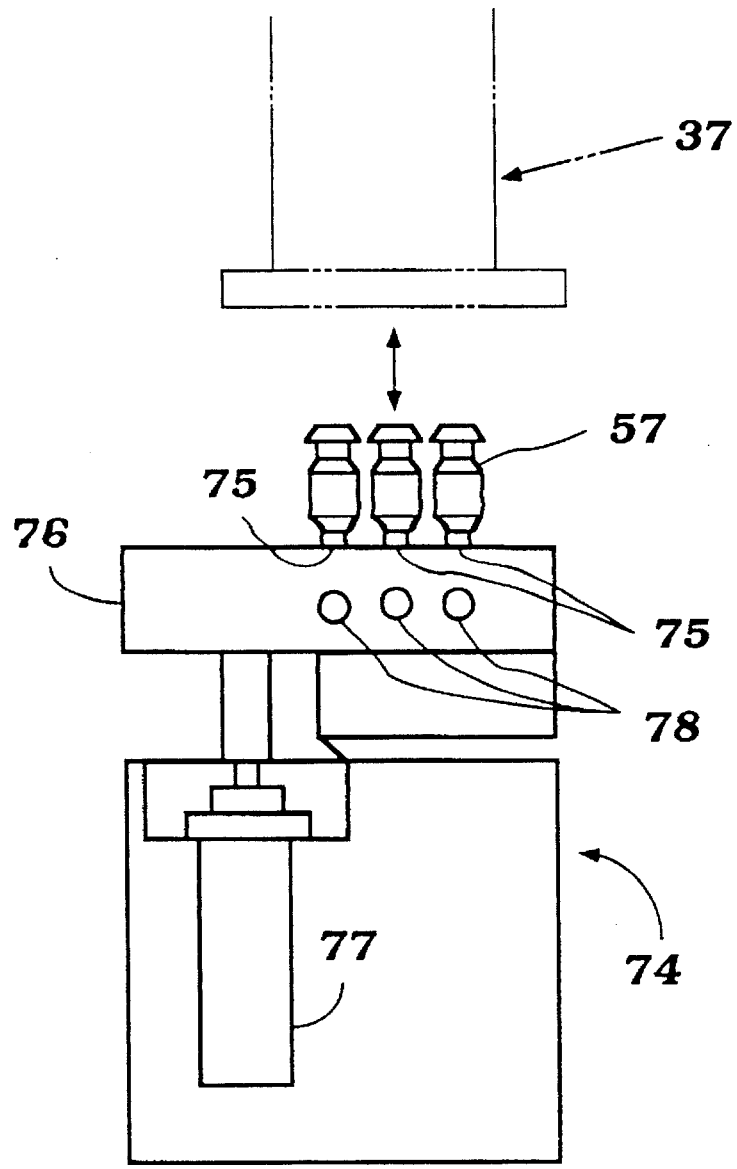
FIG. 4 is an enlarged side elevational view showing the pick up nozzle mounting section.

Turning now to the replacability of the nozzles 57, there is provided at one side of one of the feeders stations 34 on the apparatus 31 a fixed nozzle replacement section, indicated generally by the reference numeral 74. The section 74 is adapted to carry a plurality of different types of pick up nozzles 57 and when the pick up head 37 is placed in registry with the nozzle replacement section 74, as shown in phantom in FIG. 4, pick up nozzles 57 may be installed or removed.

These pick up nozzles 57 are carried on holding portions 75 of a movable plate assembly 76 which is, in turn, raised and lowered by a servo motor 77 for presenting or removing nozzles 57 from the pick up head 37. Detectors 78 are provided for each of the nozzle holders 75 so as to determine when a nozzle is held thereby or removed therefrom. The nozzle holder 75 may include any suitable type of gripping and release device so that when the pick up head 37 is lowered into position on the holders 75, a pick up nozzle 57 may be with withdrawn from or inserted into the pick up head 37 in any suitable manner.

In addition to exchanging nozzles at the nozzle exchanging station 74, when a new nozzle is inserted onto the pick up head 35 the sensor 64 is also utilized to determine that the appropriate nozzle has been exchanged. This nozzle exchanging and recognition procedure is shown in the block diagram of FIG. 6 and will now be described by reference to that FIG.

When the program starts it moves to the step S-1 so as to energize the X—X and Y—Y axis servo motors 42 and 49, respectively so as to bring the pick up head 37 into registry with the nozzle replacing section 74 and specifically initially to a empty nozzle holder 75, assuming that a nozzle is already in place and then to the appropriate nozzle holder 75 that is to contain the nozzle 57 which is to be employed for picking up that particular component 58 which will be picked up. The head 37 is then lowered by actuating the Z—Z axis servo motor of either the entire head assembly 37 (motor 53) and/or the Z—Z axis servo motor of the specific pick up head 56 (59) although this latter motor should be energized initially to completely lower the head 56. The servo motor 77 is then operated so as to raise the nozzle holder 75 so as to either insert or remove the respective nozzle at the step S-2.

Figure 6:
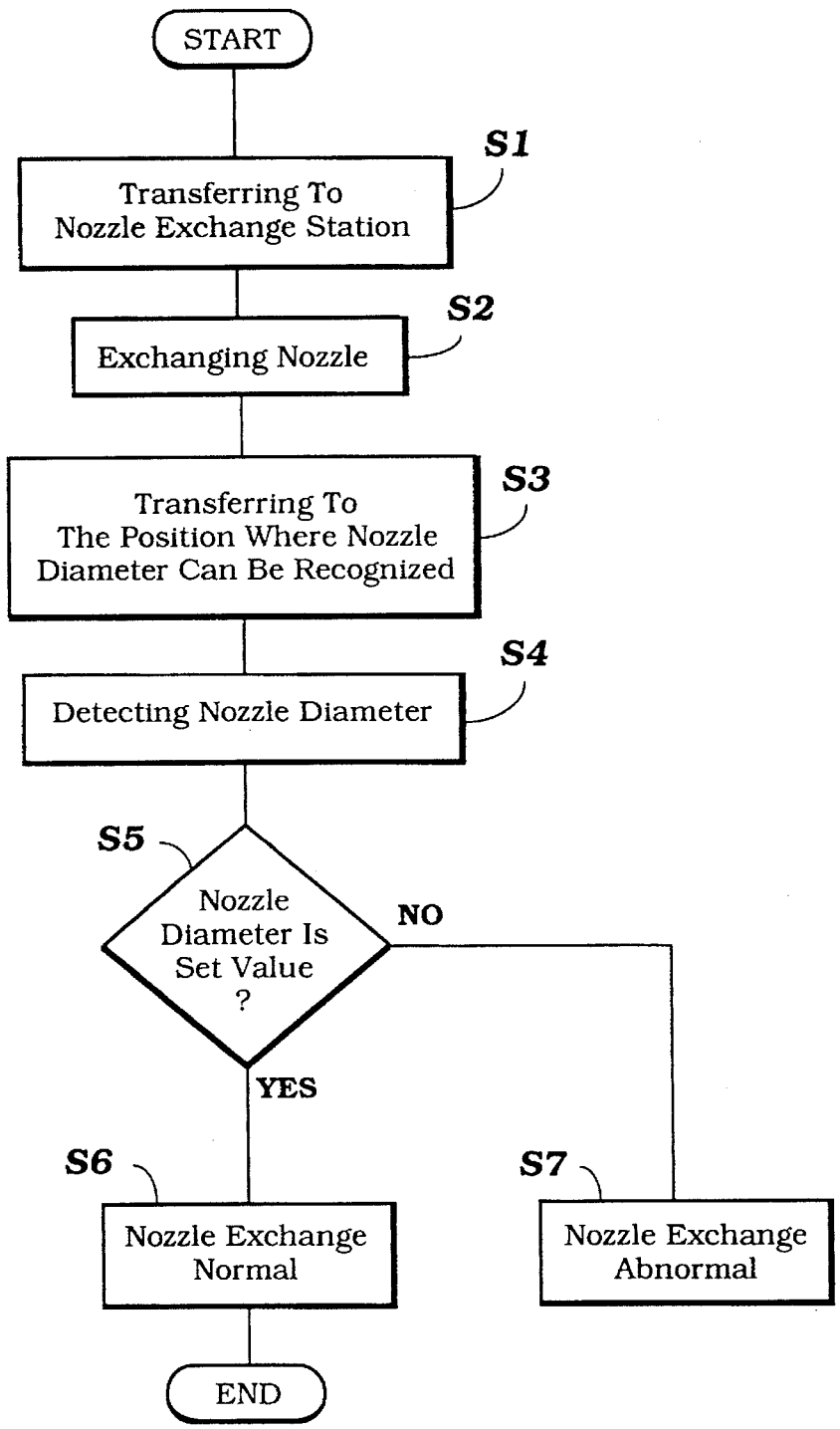
FIG. 6 is block diagram showing the methodology to determine if the correct pick up nozzle is installed.

After the nozzle has been inserted, the Z axis servo motor 59 is energized so as to elevate the pick up nozzle 57 to a position as shown in FIG. 7 and 8 wherein the pick up nozzle 57 will be positioned in registry with the detector 64, this step being indicated in FIG. 6 as the step S-3.

The photo detector 64 is then energized at the step S-4 so as to emit light rays and the CCD will then sense the diameter of the nozzle 57 that is then picked up as the step S-4. The program then moves to the step S-5 so as to compare the dimension measured with the dimension of the pick up nozzle which should have been picked up this information being contained the memory 73 as aforenoted.

If the correct nozzle has been picked up as determined at the step S-5, the program moves to the step S-6 to indicate that the exchange of the nozzle has been done normally and this portion of the program ends. If, however, at the step S-5 it is determined that the appropriate pick up nozzle has not been picked up, the program then moves to the step S-7 so as to indicate the abnormality. This may be done by a warning buzzer warning light or any other suitable mechanism.

Once the appropriate pick up nozzle 57 has been placed in the mounting head assembly 37 and specifically the mounter head 56, the program will start the routine whereby a component of the selected type to match the pick up nozzle is picked up from one of the feeder sections 36 and placed on a printed circuit board 32. This control routine and method of operation of the apparatus will now be described by reference to FIG. 9 for the block diagram and FIGS. 10–14 which illustrate certain portions of the construction and help to demonstrate the method by which the mounting procedure is followed.

Figure 9:
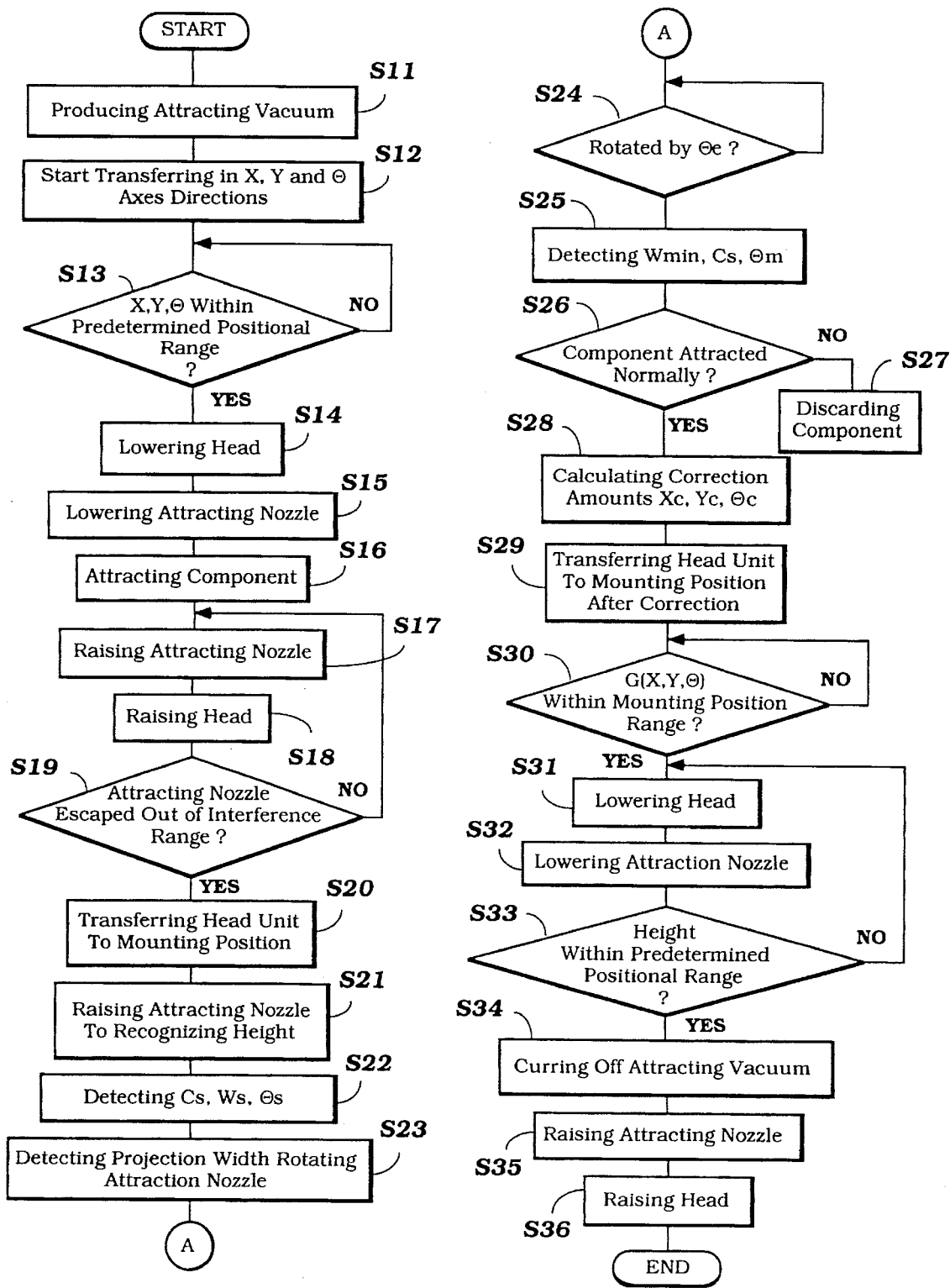
FIG. 9 is block diagram showing the routine of picking up and mounting a component.

Referring first to FIG. 9, when the program of picking up and placing a component 58 starts the program moves to the step S-11 so as to actuate the vacuum source and place the pick up nozzle 57 in a condition so that it can attract and pick up a component 58 from one of the pick up stations 36. It should be noted that in describing this control routine, the order of the steps thus described may be considered to be a preferred form of the invention but certain steps can be performed in a different order and that should be readily apparent to those skilled in the art. For example, the step S-11 of producing the vacuum for pick up could be deferred until after the pick up nozzle 57 is at the station 36 where the component 58 will be picked up.

The program the moves to the step S-12 wherein the main controller 44 and specifically the axis controller 69 causes the X and Y axis motors to operate so as to drive the pick up head assembly 37 to the appropriate station 36. At the step S-13 it is determined if the pick up nozzle 57 is at the correct location for pick up. If it is not, the program repeats until the pick up nozzle 57 is at the appropriate position in the X and Y directions.

When the pick up nozzle 57 is appropriately positioned, the motion of the mounter head 37 stops and the Z axis servo motors 53 and 59 are operated so as to lower the pick up head at the step S-14. The lowering operation continues through the step S-15 until the pick up head is at the correct location so as to pick up the component 58 from the appropriate feed section 36. When this occurs, the program will sense that a component has been picked up at the step S-16. This may be readily determined, for example by a pressure sensor, since the pressure in the vacuum line will decrease (vacuum increases) due to the blocking of the pick up nozzle 57 by the picked up component 58.

The program then moves to the step S-17 so as to raise the pick up nozzle 57 by either operating one or both of the Z axis servo motors 53 and 59. The head is then raised at the step S-18. The program then moves to the step S-19 so as to, read the output of the interference position detecting meads 68 to determine if the nozzle 57 and component 58 have been moved free of the interference range of the pick up station 36. If they are not, the program repeats back to the step S-17.

When it is determined at the step S-19 that the pick up nozzle 57 and component 58 have cleared the interference area by the output of the interference position detecting means 68, the program moves to the step S-20 to begin movement to the position wherein the component 58 is to be mounted on the printed circuit board 32. During this initial movement both the pick up nozzle will continue to be moved in the Z direction and it will be initially rotated to an angular position $\theta_s$, for a reason that will be described later.

When the nozzle 57 and component 58 and specifically the component 58 have been elevated along the Z axis to the position where the sensing station 64 is located, a sensing operation is initiated which measures the width of the component 58 which is picked up and from this data it is determined whether or not corrections are required to accommodate for a slightly misaligned pick up in the component 58 so as to compensate for this when it is positioned on the printed circuit board 32 and also to determine if the component is correctly picked up. This latter procedure will be described later.

Once the nozzle 57 and specifically the picked up component 58 are positioned in the detecting position of the sensor 64, the detecting and checking procedure begins initially by measuring the projected width $W_s$ of the component on the CCD by determining the area of the CCD 66 that is shaded, the offset of the center of this area from a reference position $W_s$ and the rotated angular position $\theta_s$ of the pick up nozzle which is known from the information derived from the encoder 63 of the R axis servo motor 62. This is all done at the step S-22.

It should be noted that the components 58 will only be roughly positioned in the openings of the feeder tape. The reason for this is it not practical to make the openings the exact size of the components 58 because then they would be difficult to extract from the openings. Also, the feeder sections 36 may not be accurately positioned and the tape may not be accurately fed. Thus, it is necessary to determine both the angular offset about the center of rotation of the pick up nozzle 57 and the offsets in the X and Y axis in order to determine how the component 58 has been picked up so that it can be accurately positioned on the circuit board 32. By determining the offset, it is possible to calculate correction factors $X_c$, $Y_c$ and $\theta_c$ to compensate for this in the mounting position when the feeder nozzle 57 is finally positioned over the circuit board 32 for mounting, as will be described. Basically this operation involves rotating the nozzle 57 and component 58 through an angle, as will be described, and measuring the projected width or length of the component during this rotation as may be seen diagrammatically in FIG. 14. This rotation step is depicted as the step S-23 in FIG. 9.

The program then moves to the step S-24 to determine if the pick up nozzle 57 and component 58 have been rotated through the angle $\theta_e$. If not, the rotation is completed. If, however, the rotation is completed then the program moves to the step S-25 so as to calculate the minimum width ($W_{min}$), offset of the center at which the nozzle has picked up the component ($C_s$), and the angle of rotation ($\theta_{min}$) at which the minimum width condition existed.

The method of measuring the location of pick up of the component 58 will now be described in addition by reference to FIG. 14. As previously noted, the components 58 will be only roughly positioned at the pick up station 36 where the pick up has occurred. Hence, the center of the pick up nozzle O will probably be displaced from the center G of the component 58. The angular position $\theta$ will also vary about the rotational axis R.

In order to insure that the component is in a position other than its minimum width position when initially picked up, once pick up has been accomplished, as has been noted the component is rotated so that it will be rotated clockwise through an angle $\theta_s$ from the initial angular position as determined by an arbitrary line M drawn through the center of the nozzle O which constitutes the ($\theta=0$) position.

Hence, this initial rotation through the angle $\theta_s$ will position the component 58 in the angle $\theta_s$ so that when the light is emitted from the light source 65 to the light sensitive pick up 66, an area indicated as $W_s$ which is equal to the width or length of the component 58 in a plane parallel to the R axis of the pick up nozzle 57 will be occluded. When this measurement is taken, the center G of the component K will be displaced at a distance $C_s$ from a line L which forms the perimeter atone side of the measurement apparatus.

As noted, the pick up nozzle 57 is then rotated in a counter clockwise direction at the step S-23 from the previous clockwise rotation through a position where the minimum projected width $W_{min}$ is measured. At this point, it will be possible to determine the location of the center G at the mid point of $W_{min}$ and hence at a distance $C_{min}$ from the line L. The rotation continues until a rotation through the predetermined angle $\theta_e$ has occurred as previously noted as determined at the step S-25. The specific angle $\theta_e$ does not have to be a large angle and 45° is an appropriate angle so as to insure that the $W_{min}$ condition can be met.

Once the angular measurement necessary to determine the minimum width $\theta_{min}$ from the position $\theta_s$ has been determined and the width at the minimum width position $W_{min}$ and the initial width $W_s$ have been measured, it will then be possible to determine the actual position of the pick up nozzle O relative to the center G of the component 58 both in the X and Y planes and also the angular relationship $\theta$ so as to determine the necessary correction factors in order to place the component 58 at the desired location and orientation on the substrate 32 to which it is to be mounted.

Figure 14:
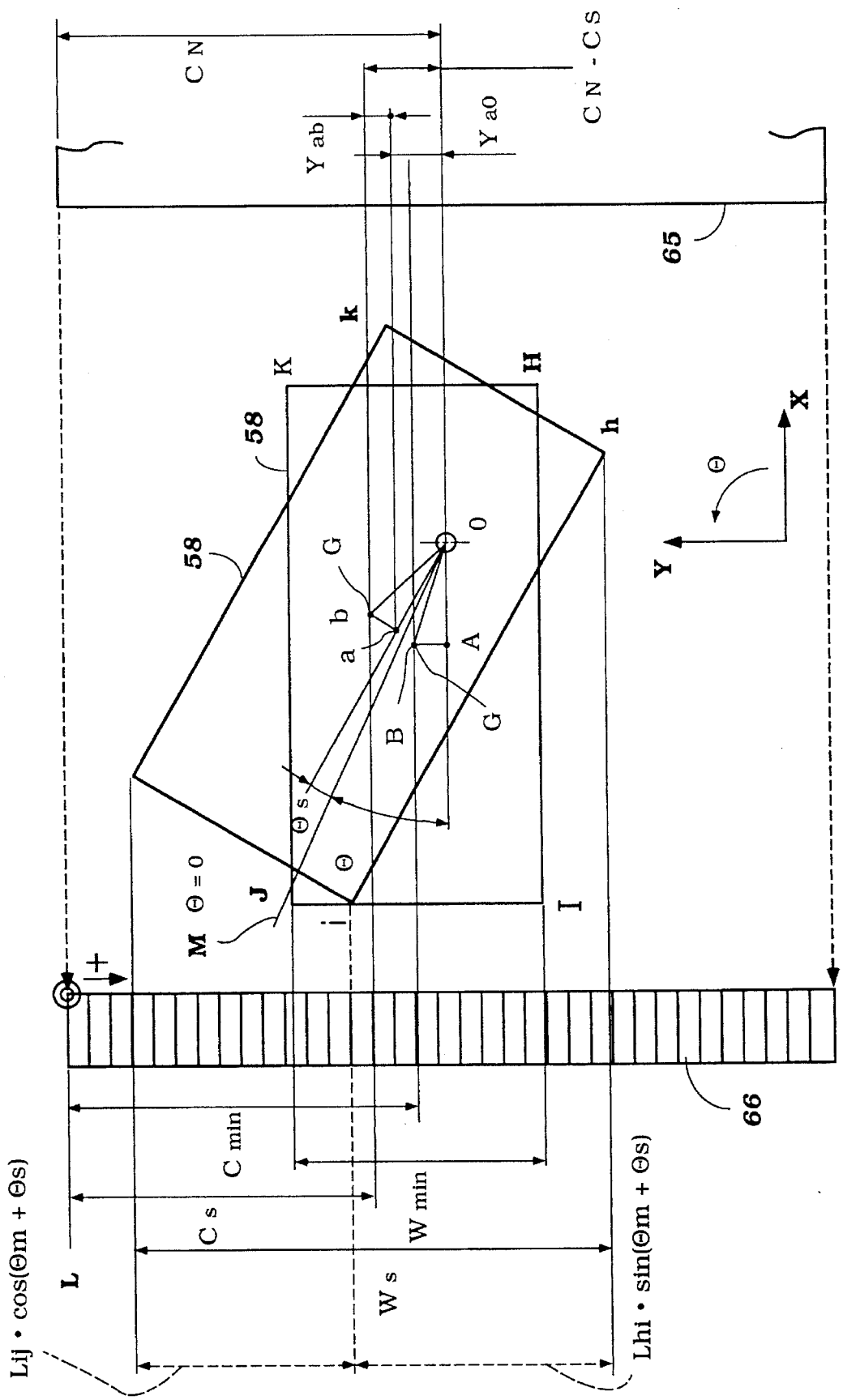
FIG. 14 is a view taken generally in the direction of FIG. 8 and shows how the orientation of the point of picking up of the component and the correct picking up of the component are determined in the optical sensing station.

These calculations may be best understood by reference to FIG. 14 which shows in solid lines the $\theta_s$ position of the component 58 and its minimum width position. In this arrangement, the correction factors $Y_c$ and $\theta_c$ are easily determined in accordance with the following relationships:

$$Y_c = C_{min} - C_N$$

$$\theta_c = \theta_{min}$$

In these equations, $C_N$ is distance of the center position O of the attracting nozzle 57, as shown in FIG. 14 from the edge of the measurement to the nozzle center which will be constant under all angular rotations of the component 58. Hence, $C_N$ is a known factor and thus $Y_c$ is easily calculated since $C_{min}$ is easily calculated. Hence, the correction amounts $Y_c$ and $\theta_c$ are values that are obtained substantially by actual measurement and no real calculation is required.

The value of $X_c$ however does require calculations using the data $C_s$, $\theta_s$, $C_{min}$ and $\theta_{min}$ obtained by the detected figures. The basis for these calculations are as follows and again reference is made to FIG. 14.

We know that AOB = aOb. Thus, a b = AB = $C_N - C_{min}$. Thus the projected length $W_{ab}$ of the side a b on the Y axis (the plane of measurement) can be determined from the following relationship:

$$Y_{ab} = (C_N - C_{min}) \cos(\theta_{min} + \theta_s)$$

Similarly the projected length $Y_{ao}$ of the side "a o" on the measurement plane of the Y axis is obtained by the following equation:

$$Y_{ao} = a\,o\sin(\theta_{min} + \theta_s)$$
$$= (C_N - C_s) - Y_{ab}$$
$$= (C_N - C_s) - (C_N - C_{min})\cos(\theta_{min} + \theta_s)$$

Therefore, the correction amount $X_c$ and the X axis direction can be calculated from the above equation by the following equation:

$$X_c = A\,O = a\,o$$
$$= \frac{(C_N - C_s) - (C_N - C_{min})\cos(\theta_{min} + \theta_s)}{\sin(\theta_{min} + \theta_s)}$$

The method of making this calculation is described in more detail on the copending application entitled METHOD FOR MOUNTING COMPONENTS AND AN APPARATUS THEREFOR, filed in my name and the names of Hiroshi Sakurai and Horoyuki Ohta, Ser. No. 08/073,741, filed Jun. 8, 1993 the disclosure of which is incorporated herein by reference.

During the process of the making of the calculations aforenoted, which is actually done at the step S-28, the program decides at the step S-26 whether the component has been attracted normally. FIG 12 shows a normal attraction of the component 58 while FIGS. 12 and 13 show abnormal attractions. As may be seen in FIG. 12, a pick up has occurred close to the edge of the component 58 and as a result, when the nozzle 57 is raised, the component 58 can slip so that its top edge rather than its side edge is exposed. Alternatively and as shown in FIG. 13, the component may actually slip so that a side edge is attracted by the pick up nozzle 57 rather than the top surface thereof.

The measurement previously made of the minimum width thickness of the component 58 $W_{min}$ can be utilized not only to determine the corrective factor but also to determine if the component 58 has been correctly picked up. This determination can be made in accordance with the following equations:

$$W_{min} \leq (\text{the length of the shorter side of the component 58}) \times (1-\alpha),$$

$$W_{min} \geq (\text{the length of the longer side of the component}) \times (1+\alpha),$$

where $\alpha$ is a safety factor.

$\theta_{min} = \theta_s$
$\theta_{min} = \theta_e$

Figure 15:
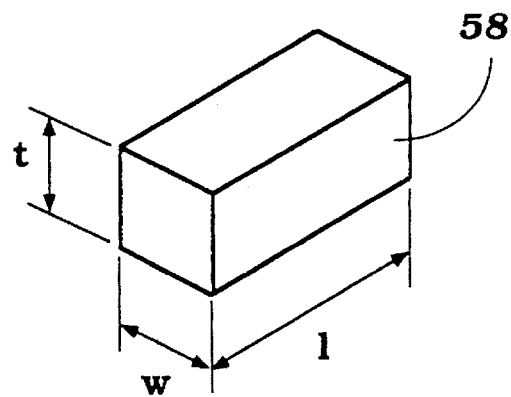
FIG. 15 is a perspective view showing a component of the type which may be picked up.
Figure 16:
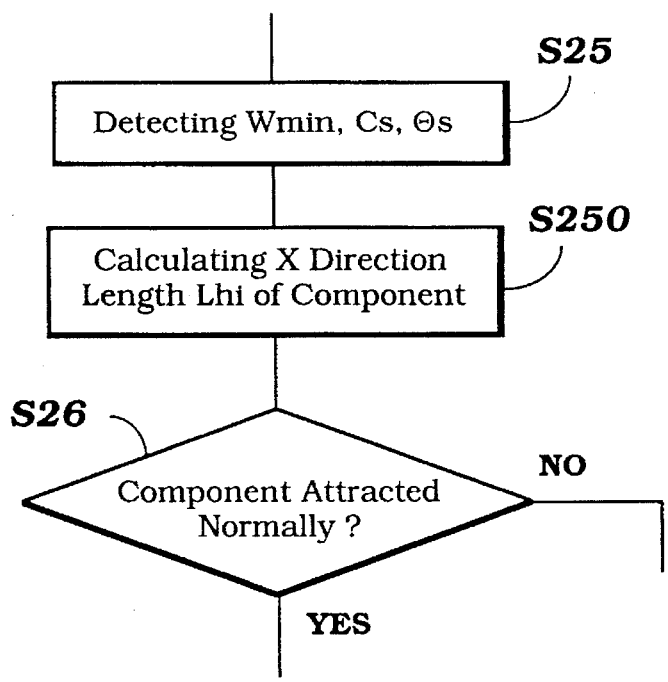
FIG. 16 is a block diagram showing an alternate method for determining if a component has been picked up incorrectly.

The foregoing methodology for determining if the component 58 is correctly picked up is valid only for components where the minimum width of the component being measured is not substantially equal to than the thickness of the component 58. If the component 58 is of a dimension as shown in FIG. 15 where the width is substantially equal to the thickness then it is necessary to make the comparison based upon the relationship of the length of the component $L_{hi}$ as shown in FIG. 15. This necessitates the insertion of a further step after the step S-25 as shown in FIG. 9 this further step being shown in FIG. 16 which is a modification of the program to suit the situation when the width $W_{ij}$ is substantially equal to height T. From the measurement already made it is possible to make a calculation of the X direction length $L_{hi}$ as shown in FIG. 14.

The X direction length $L_{hi}$ Of the component 58 is calculated at the step S-250 as follows:

Lhi=$L_{HI}$: X direction length of the component (length of the line segment hi is equal to the length of the line segment HI), and Lij =$L_{ij}$: length of the line segment ij is equal to the length of the line segment IJ, $W_s$ is given by:

$$W_s = L_{hi}\cdot\sin(\theta_m + \theta_s) + L_{ij}\cdot\cos(\theta_m + \theta_s)$$

as shown in FIG. 14. Since $L_{ij} = L_{IJ} = W_{min}$ the X direction length of the component $L_{hi}$ is obtained by $$L_{hi} = \{(W_s - W_{min}\cdot\cos(\theta_m + \theta_s))\}/\sin(\theta_m + \theta_s).$$

Since the X direction length $L_{hi}$ of the component obtained above is to be the length of the longer side of the component if the component is attracted normally, in addition to the conditions in the decision at the step S-26, if $L_{hi} \leq (\text{longer side length of the component}) \times (1-\beta)$, or $L_{hi} \geq (\text{longer side length of the component}) \times (1+\beta)$, where $\beta$ is a safety factor, the component attraction is decided abnormal.

If at the step S-26 it has been determined that the component is attracted abnormally, the program moves to the step S-27 so as to discard the incorrectly picked up component 58.

If, however, at the completion of the step S-26 it has been determined that the component is attracted normally, then program moves to the step S-28 to make the correction calculations in the manner as aforenoted.

The program then moves to the step S-29 so as to continue moving the head unit 37 to the mounting position now with the correction factors being calculated in. That is, the mounting position is corrected by the $X_c$, $Y_c$ and $\theta_c$ corrections as aforenoted.

At the step S-30 it is determined whether the head assemble 37 is in the mounting position. If it is not, the program repeats until the mounting position is reached.

Once the mounting position is reached, the program moves to the step S-31 so as to lower the whole head assembly 33 by actuating the Z axis servo motor 53 and then to subsequently lower the pick up nozzle 57 and component 58 by actuating their Z axis servo motor 59. This operation is continued at the step S-32 if the height is not determined to be the correct mounting height.

When the correct mounting position is reached as determined at the step 33 then at the step S-34 the attracting vacuum is shut off so as to release the component 58 from the pick up nozzle 57 and deposit it on the circuit board 32. Then at the step S-35, the nozzle Z axis servo motor 59 is actuated to raise it and subsequently at the step S-36, the head Z axis servo motor 53 is operated to raise the mounting head and the program then ends.

Although there is a distinct advantage in both using the detecting head 64 for determining that the correct nozzle 57 has been inserted at the station 74, it is to be understood that a separate optical sensor for this purpose may be provided. Preferably such a separate optical sensor can be mounted in a fixed position immediately adjacent the nozzle insertion station 74.

Figure 17:
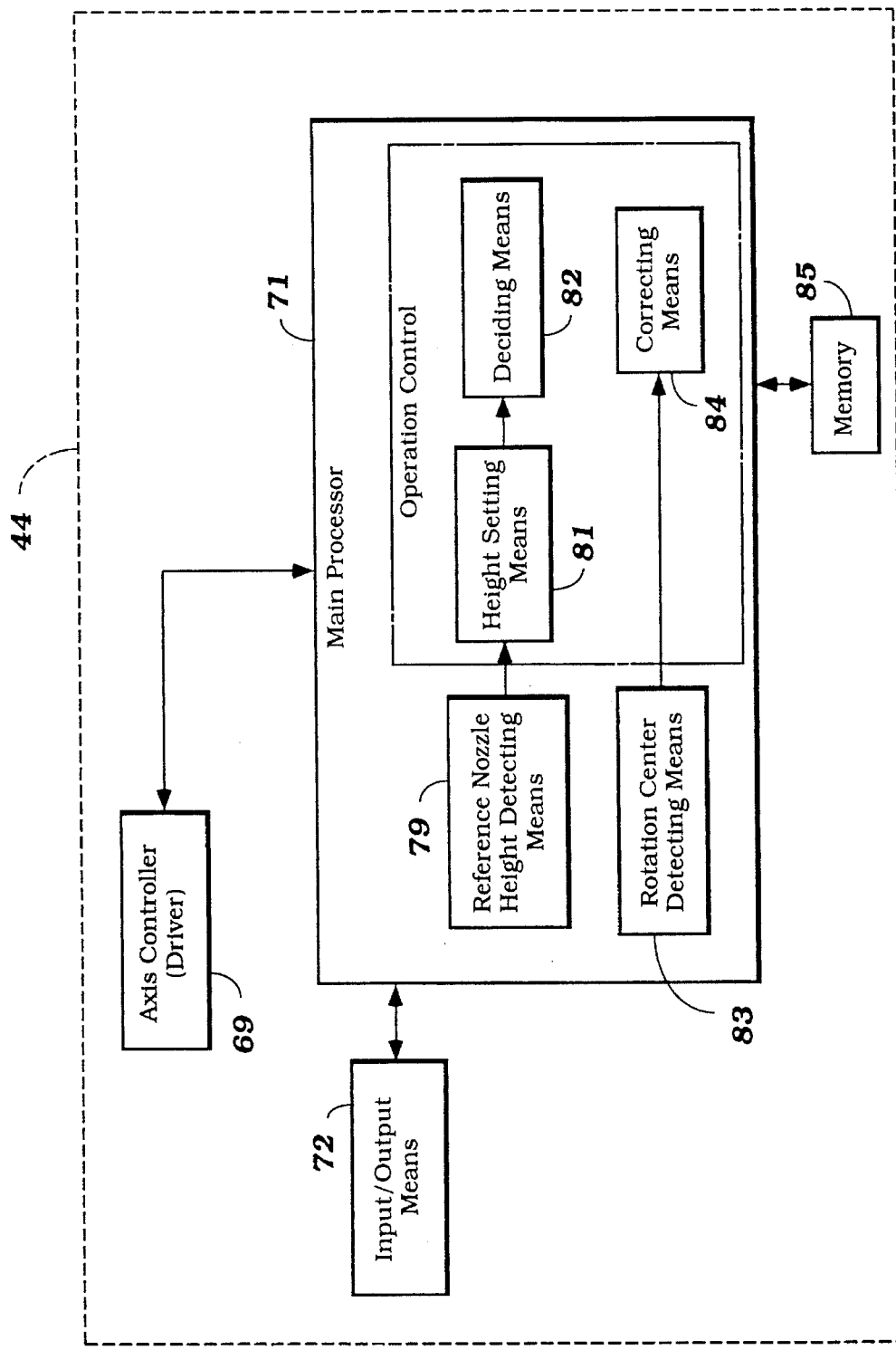
FIG. 17 is partial block diagram showing the arrangement of certain components of an apparatus adapted to perform another function in accordance with an embodiment of the invention.
Figure 19:
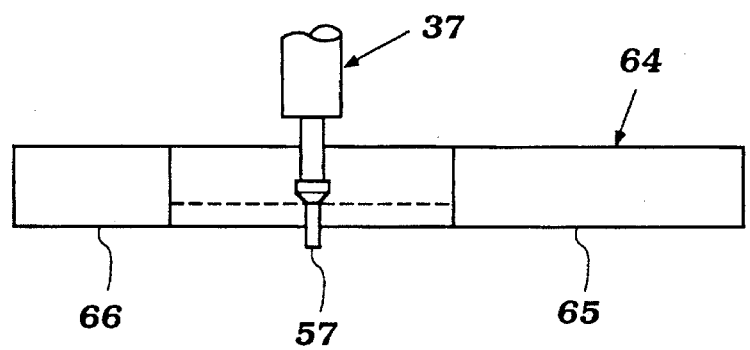
FIGS. 19, 20 and 21 show how the fixed position is determined in this method with FIG. 19 showing the beginning of elevation of the pick up nozzle, FIG. 20 showing the position used to determine the reference position and FIG. 21 showing how the fixed reference position is determined.
Figure 20:
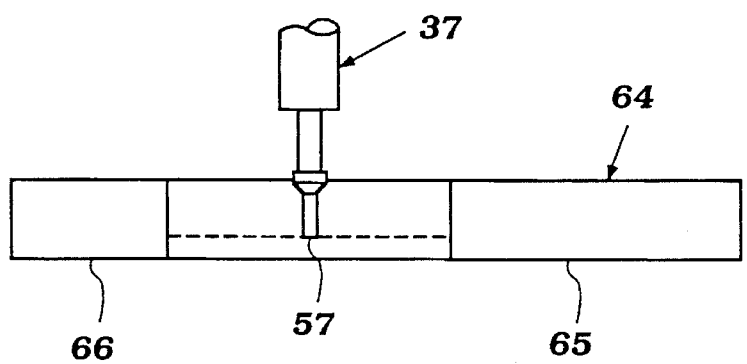
Figure 21:
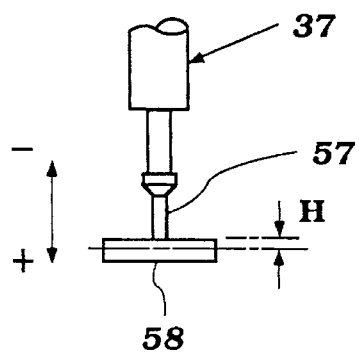

It has been previously noted that there may be an advantage determining a fixed reference height position for the pick up nozzle 57 after it has been inserted at the nozzle mounting station 74. FIGS. 17–21 show how this may be done. This is done basically with the same apparatus shown schematically at FIG. 5 but the main control 44 in addition to those components that have already been described, adds certain further components which components actually form parts of the main processor 71. Only these components are shown in FIG. 17 with the methodology for determining the reference position for the pick up nozzle 57 being shown in FIG. 18 and the sequence of operation is shown in FIGS. 19–21 which show the reason for establishing the reference height position.

It is to be understood that it is desirable to maintain the optical sensor 64 as low as possible and thus only a narrow band of the height of the component 58 is read in the detector 69. Furthermore, it is desirable to insure that the component 58 is actually read at a position along its height where recognition is suitable. Thus, as shown in FIG. 21, if that height is the distance H from the lower edge of the pick up nozzle it is desirable to establish a reference position for the pick up nozzle 57 at the step S-21 of the program of the FIG. 9 so as to insure that the desired position of the desired portion component 58 may be read. The recognizing height is set in accordance with the following equation:

$$Z_r = Z_o - H$$

(considering the downward direction as being positive from the X axis as shown in FIG. 21)

Figure 18:
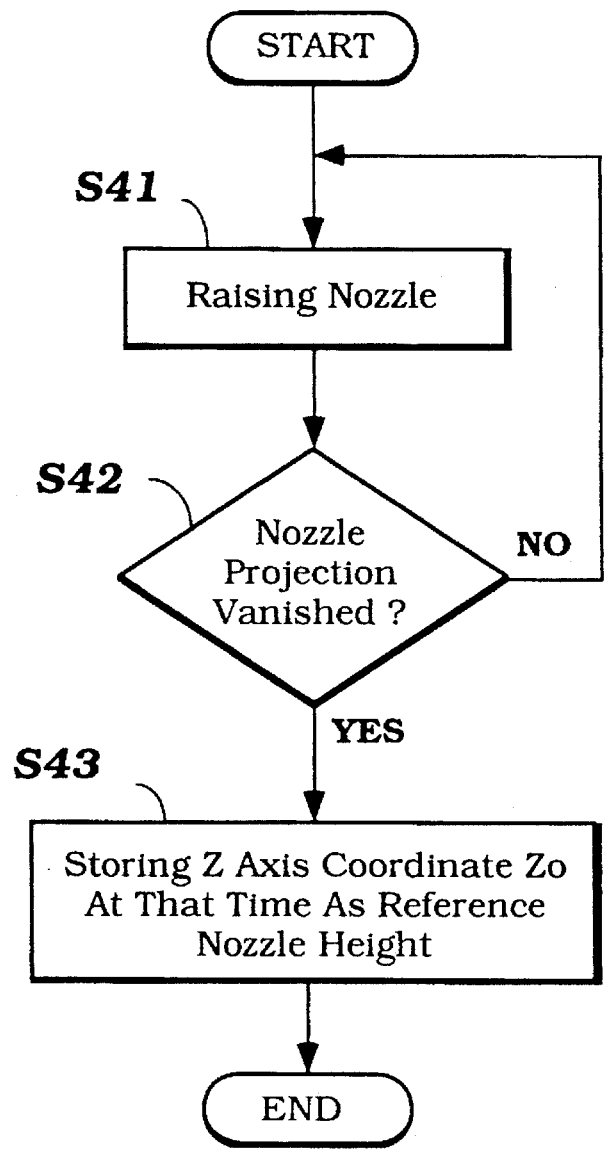
FIG. 18 is a block diagram showing the control routine for performing this function.

The way $Z_o$ is measured is accomplished by a control routine which as shown in FIG. 18 which control routine will be established prior to the step S-21 in FIG. 9 and can be done initially after the nozzle 57 is inserted into the pick up head assembly 37 at the station 74. In that event, these steps would follow the step S-6 of the flow chart of FIG. 6.

Referring now to FIG. 18, as soon as the pick up nozzle 57 is inserted and is moved into registry with the detector 64 and after the sensing operation for the correctness of the nozzle 57 is completed, the nozzle is again raised at the step S-41 while the detector 64 is still turned on. The program then moves to the step S-42 to determine if the nozzle is still visible as is shown in FIG. 19. If the nozzle is still visible the program continues to repeat. If, however, the nozzle has vanished from view as seen in FIG. 20, then the program moves to the step S-43 to store the Z axis coordinate $Z_0$ at that time and this will be the nozzle reference height that is utilized in the foregoing equation so as to set the recognizing height This recognizing height sensing arrangement is shown at the block by block 79 in FIG. 17. Although it is possible to use the apparatus without the height detecting arrangement as shown and described in FIGS. 18–21 and set a predetermined height position depending upon the type of nozzle selected, errors can occur if this is done due to errors in the positioning of the pick up nozzle 57 on the head assembly 37. Thus, it is more likely errors can be avoided through the use of the reference nozzle height detecting means 79 as described.

This outputs its signal to a height setter 81 in the main processor 71 and thus outputs this signal to a deciding portion of the main processor, indicated by the reference numeral 82, that determines if the nozzle is raised to the recognition height at the step S-21 of FIG. 9.

Figure 22:
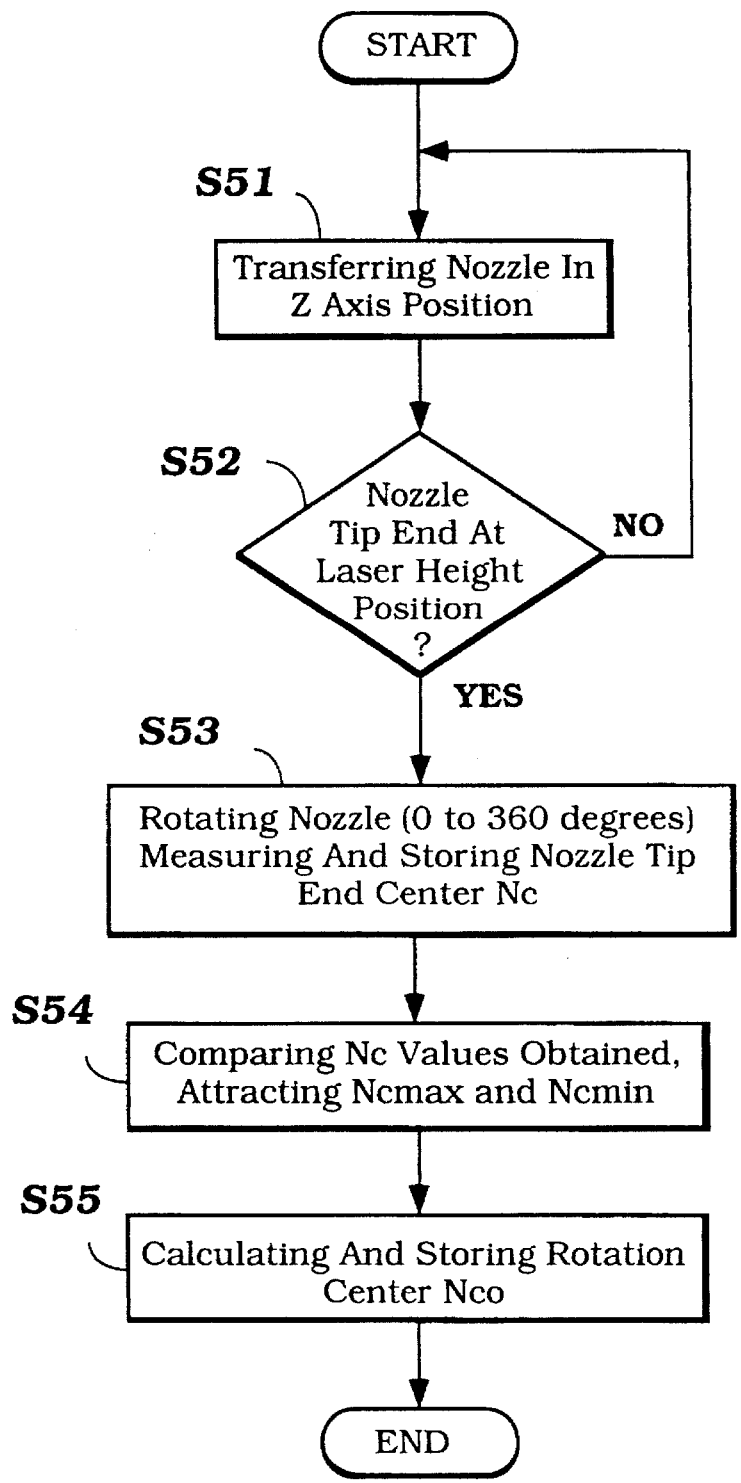
FIG. 22 is a block diagram showing another possible control routine in accordance with another facet of the invention. This control routine is employed for determining the orientation of the rotational axis of the installed pick up nozzle.
Figure 23:
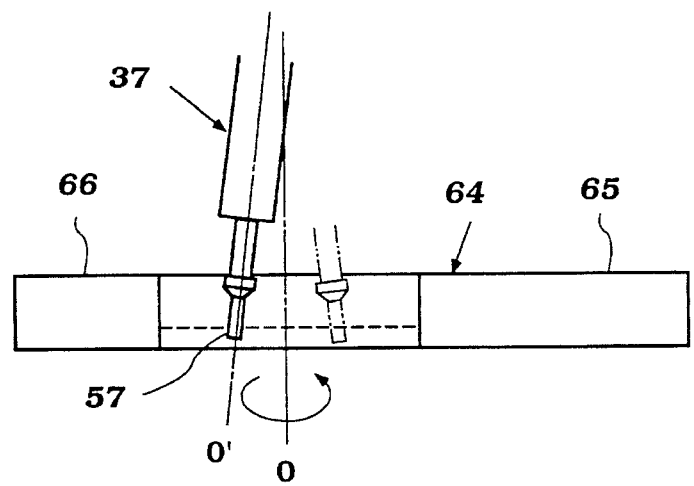
FIGS. 23, 24 and 25 are views showing how the rotational axis orientation is determined.

In addition to differences in the height of the pick up nozzle 57 as installed, the installation process may cause either an angular installation of the nozzle 57 on the pick up head 37 or actually could cause some deformity in the rotational axis 0 of the actual head 37 as shown in FIG. 23. If this occurs, when there is rotation of the pick up nozzle 57 and picked up component 58, the minimum width measurements may be incorrect. The construction shown in FIG. 17–25 still further includes components for determining if there is angular deviation and these components are incorporated into the control unit 43 and include a rotational center detecting means 83, which will be described in conjunction with FIGS. 22–25 and which outputs its signal to a rotational detecting means 84. There is further provided a memory 85 that memorizes the height $Z_o$ and the rotational center detection $N_{co}$ for the particular nozzles in question.

Referring now in detail particularly to FIGS. 22–25, the method for determining if the rotational axis 0' of the pick up nozzle 57 is aligned with the desired rotational axis 0 or if not the amount of offset will be described. This determining method proceeds along with the steps as shown in FIG. 22 and this method may be followed after the nozzle 57 has been inspected and determined to be the correct one and when it is at a height still within the detector 64. This method, if employed with the method shown in the steps of FIG. 18, could be performed either prior to the performance of that control routine or subsequent to it. If it performed subsequently, then the nozzle 57 will have to be lowered again into the detection area.

The program starts at the step S-51 wherein the nozzle is transferred to the position in the sensor station 64. At the step S-52 it is determined if the nozzle tip is in the detection area and if it is not the program repeats.

Figure 24:
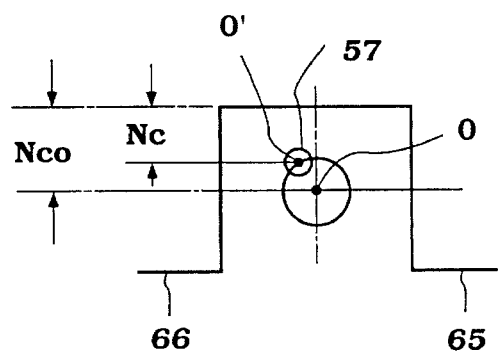
Figure 25:
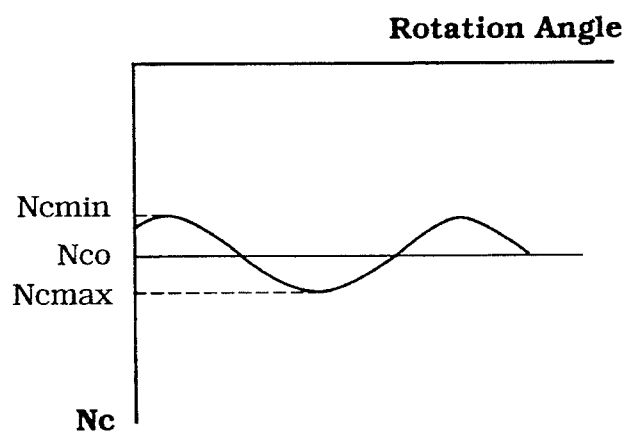

If, however, at the step S-52 it is determined that the nozzle 57 is positioned appropriately within the detector 64 then the program moves to the step S-53 so as to rotate the nozzle 57 through 360° as shown in FIGS. 23–25. The position of the nozzle 57 on the detector portion 66 is then measured as shown in these Figures and if there is any eccentricity it will follow a curve as shown in FIG. 25. Thus, the nozzle center $N_c$ will deviate from the desired nozzle center Nco in a sinusoidal fashion.

If there is such eccentricity, then at the step S-54 the unit and particularly the rotational center detecting means 83 of the main processor 71 then calculates the eccentricity at the step S-54 by summing $N_{cmax}$ and $N_{cmin}$ and at the step S-55 determines the desired rotational center $N_{co}$ by averaging the sum of the maximum and minimum values. Thus, in addition to the other corrections aforenoted, the nozzle 57 is rotated to the position $N_{co}$ before the calculations for mounting are made. That is, $N_{co}$ is substituted for the values of $C_n$ in the equations previously mentioned in determining the correction factors $X_c$, $Y_c$ and $\theta_c$.

Like the height determination of FIGS. 18–21, the rotation calculation of routine of FIGS. 22–25 rather than being performed in the sensors 64 carried by the mounting head 37 may be performed in another sensor. However, there is an advantage to performing this function in the same apparatus since it can speed up the operation inasmuch as the measurements and corrections may be made while the mounting head assembly 37 is moving toward its mounting position.

It should be readily apparent that the described embodiments of the invention are very effective in providing accurate mounting positioning of a component and also insuring against any mistaken positioning. Of course, the foregoing description is that of preferred embodiments of the invention and various changes in modifications may be made without departing from the spirit and scope of the invention, as defined by the appended claims.

We claim:

1. A component handling apparatus adapted to pick up and position components comprising a base and a pick up portion supported for movement relative to said base including rotation about a desired rotational axis, a sensing station for sensing the orientation of an article upon relative rotation of said article in said sensing station when said article is within said sensing station and held by said pick up portion, and means for positioning said pick up portion in said sensing station in a position for sensing only the angular deviation of said pick up portion relative to desired said rotational axis.

2. A component handling apparatus set forth in claim 1 wherein the angular orientation of the pick up portion sensed in the sensing station is the angular orientation of the pick up portion relative to a holding rotational component of the handling device.

3. A component handling apparatus as set forth in claim 2 wherein the means for positioning the pick up portion comprises means for detachably connecting a plurality of different types of pick up portions for performing operations on different types of components.

4. A component handling apparatus as set forth in claim 3 wherein the orientation of the lower end of the pick up portion is also sensed in the sensing station.

5. A component handling apparatus as set forth in claim 4 wherein the sensing station is an optical sensing station including a light source and a receptor to receive light transmitted around the sides of the article and have a shadow cast by the article in a plane of measurement.

6. A component handling apparatus as set forth in claim 5 wherein the height of the pick up portion is also sensed in the sensing station so as to insure that a component picked up by the pick up portion can be accurately positioned for its sensing also in the same sensing station.

7. A component handling apparatus as set forth in claim 6 wherein the height of the pick up portion is sensed by elevating the pick up portion through the sensing station until no shadow is received on the receptor.

8. A component handling apparatus as set forth in claim 7 wherein the means for positioning the pick up portion is adapted to position the pick up portion in a location to pick up a component from a feeder, to move the component to a sensing station wherein a sensing operation is performed on the component and subsequently deposit the component at an accurate position at the deposit station, the sensing station that senses the component being effective to recognize both the orientation of the component relative to the pick up portion and to determine if the component is picked up in an orientation so that it can be properly deposited.

9. A component handling apparatus as set forth in claim 8 wherein the orientation of the component relative to the pick up device is determined by taking certain measurements of the component and calculating from those measurements a correction amount when the article is deposited.

10. A component handling apparatus set forth in claim 9 wherein the pick up portion is rotatable about a rotational axis R and moveable along X, Y and Z axes from the pick up station to the deposit station, the sensing station measures the projected length of the component in a plane parallel to the axis of rotation of the pick up portion, and includes means for measuring the projected length of the component in the plane at two angular positions and measuring the angular rotation between the two measured positions for determining the place where the component has been picked up by the pick up portion.

11. A component handling apparatus as set forth in claim 10 wherein the offset of the center of the component from the center of the pick up portion in the X, Y and angular planes are calculated.

12. A component handling apparatus as set forth in claim 11 wherein the calculations are made by trigonometric relationships.

13. A component handling apparatus as set forth in claim 12 wherein the component is rotated to a second position wherein the projected length in the plane is at an extreme of the projected length in the plane.

14. A component handling apparatus as set forth in claim 13 wherein the projected length in the second position is the narrowest length.

15. A component handling apparatus as set forth in claim 14 wherein the components are picked up by the pick up portion at a station wherein the components are only roughly oriented in a position.

16. A component handling apparatus as set forth in claim 15 wherein the component is rotated to an initial angular position prior to the measurement.

17. A component handling apparatus as set forth in claim 16 wherein the initial rotation is in a direction opposite from the direction of rotation from the first position to the second position.

18. A component handling apparatus as set forth in claim 16 wherein the component is rotated to the initial position prior to the beginning of measurements and after the component is initially picked up.

19. A component handling apparatus set forth in claim 10 wherein the components are picked up by the pick up portion at a station wherein the components are only roughly oriented in a position.

20. A component handling apparatus as set forth in claim 19 wherein the component is rotated to an initial angular position prior to the measurement.

21. A component handling apparatus as set forth in claim 20 wherein the initial rotation is in a direction opposite from the direction of rotation from the first position to the second position.

22. A component handling apparatus as set forth in claim 20 wherein the component is rotated to the initial position prior to the beginning of measurements and when the component is initially picked up.

23. A component handling apparatus as set forth in claim 10 wherein the determination whether the component has been picked up in an orientation so that it can be deposited is made by comparing the projected length with the known length of the object.

24. A component handling apparatus as set forth in claim 23 wherein the projected length is compared with the known length only if the projected length is substantially different from the thickness of the component.

25. A component handling apparatus as set forth in claim 24 wherein if the projected length is substantially equal to the thickness of the component then the other dimension of the component is calculated from the measurements and compared with the corresponding known dimension of the component to determine if the article oriented correctly as picked up.

26. A component handling apparatus as set forth in claim 10 wherein the component is rotated to a second position wherein the projected length in the plane is at an extreme of the projected length in the plane.

27. A component handling apparatus set forth in claim 26 wherein the projected length in the second position is the narrowest length.

28. A component handling apparatus as set forth in claim 10 wherein the measuring station comprises a light source and a photo-electric receptor positioned in the plane.

29. A component handling apparatus as set forth in claim 2 wherein the means for positioning the pick up portion in the sensing station moves the pick up portion align a vertical Z—Z axis.

30. A component handling apparatus as set forth in claim 29 wherein the orientation of the lower end of the pick up portion is also sensed in the sensing station.

31. A component handling apparatus as set forth in claim 30 wherein the sensing station is an optical sensing station including a light source and a receptor to receive light transmitted around the sides of the article and have a shadow cast by the article in a plane of measurement.

32. A component handling apparatus as set forth in claim 31 wherein the orientation of the lower end of the pick up portion is sensed in the sensing station so as to insure that a component picked up by the pick up portion can be accurately positioned for its sensing also in the same sensing station.

33. A component handling apparatus adapted to pick up and position components comprising a base and a pick up portion supported for movement relative to said base, a sensing station having a light source and a receptor to receive light transmitted around an article held by said pick up portion in the sensing station to cast a shadow on the receptor for sensing the orientation of an article upon relative rotation of said article in said sensing station when said article is within said sensing station, and means for positioning said pick up portion in said sensing station in a position for sensing only the height of said pick up portion by elevating said pick up portion without a component through said sensing station until no shadow is received on the receptor.

34. A component handling apparatus as set forth in claim 33 wherein the height of the pick up portion is sensed in the sensing station so as to insure that a component picked up by the pick up portion can be accurately positioned for its sensing also in the same sensing station.

35. A component handling apparatus as set forth in claim 34 wherein the pick up portion is also rotatable and its rotation is employed to also sense the center of rotation of the pick up portion during its rotation.

36. A component handling apparatus adapted to pick up and position components comprising a base and a pick up portion supported for movement relative to said base, a sensing station for sensing the orientation of an article held by said pick up portion upon relative rotation of said article in said sensing station when said article is within said sensing station, means for positioning said pick up portion in said sensing station in a position for sensing only the orientation of said pick up portion and means for rotating said pick up portion in said sensing station for determining the center of rotation of the pick up portion so as to permit orientation of the component accurately when it is to be positioned.

37. A component handling apparatus as set forth in claim 36 wherein the sensing station is an optical sensing station including a light source and a receptor to receive light transmitted around the sides of the article and have a shadow cast by the article in a plane of measurement.

38. A component handling apparatus as set forth in claim 37 further including means for detecting the location of a component picked up by the pick up portion by rotating the article in the sensing station.

39. A component handling apparatus as set forth in claim 36 further including means for detecting the location of a component picked up by the pick up portion by rotating the article in the sensing station.

40. A component handling method adapted for picking up and positioning components using a pick up portion having a desired rotational axis and a sensing station adapted to sense a condition of an article, said method comprising the step of for positioning said pick up portion in said sensing station, rotating the pick up portion in the sensing station and sensing the angular deviation of said pick up portion relative to the rotational axis.

41. A component handling method as set forth in claim 40 wherein the pick up portion is moved in the sensing station along a vertical Z—Z axis.

42. A component handling method as set forth in claim 41 wherein the sensing station is an optical sensing station including a light source and a receptor to receive light transmitted around the sides of the article and have a shadow cast by the article in a plane of measurement.

43. A component handling method as set forth in claim 42 wherein the height of the pick up portion is also sensed in the sensing station so as to insure that a component picked up by the pick up portion can be accurately positioned for its sensing also in the same sensing station.

44. A component handling method as set forth in claim 43 wherein the height of the pick up portion is sensed by elevating the pick up portion through the sensing station until no shadow is received on the receptor.

45. A component handling method as set forth in claim 41 wherein the orientation of the lower end of the pick up portion is also sensed in the sensing station.

46. A component handling method including a pick up portion movable in a vertical direction from a pick up position into a sensing station comprised of a light source for emitting light rays and a receptor if or receiving light rays and a shadow cast by an article held by said pick up portion in the sensing station, said method comprising determining the height of the pick up portion by elevating the pick up portion through the sensing station without a component until no shadow is received on the receptor.

* * * * *

UNITED STATES PATENT AND TRADEMARK OFFICE
Certificate

Patent No. 5,570,993                                                              Patented: November 5, 1996

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Hitoshi Onodera, Iwata, Japan; Hiroshi Sakurai, Iwata, Japan; and Steven K. Case, Minneapolis, MN.

Signed and Sealed this Sixth Day of April, 1999.

KAREN M. YOUNG
*SPE*
Art Unit 3652